United States Patent
Bonges et al.

(10) Patent No.: US 7,712,057 B2
(45) Date of Patent: May 4, 2010

(54) DETERMINING ALLOWANCE ANTENNA AREA AS FUNCTION OF TOTAL GATE INSULATOR AREA FOR SOI TECHNOLOGY

(75) Inventors: Henry A. Bonges, Milton, VT (US); Terence B. Hook, Jericho, VT (US); William F. Pokorny, Mansfield, PA (US); Jeffrey S. Zimmerman, Swanton, VT (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 11/955,653

(22) Filed: Dec. 13, 2007

(65) Prior Publication Data

US 2009/0158230 A1    Jun. 18, 2009

(51) Int. Cl.
*G06F 17/50* (2006.01)
(52) U.S. Cl. .................................. 716/4; 716/1; 716/5
(58) Field of Classification Search ............... 716/4, 716/8–9, 13, 19, 1, 5
See application file for complete search history.

(56) References Cited

U.S. PATENT DOCUMENTS

| 7,067,886 | B2 | 6/2006 | Bonges et al. |
| 2001/0044925 | A1* | 11/2001 | Noguchi ..................... 716/4 |
| 2007/0234264 | A1* | 10/2007 | Ono ........................... 716/11 |
| 2009/0026502 | A1* | 1/2009 | Wu et al. ..................... 257/207 |

OTHER PUBLICATIONS

Gernhoefer et al., "Layout Optimization Using Parameterized Cells", U.S. Appl. No. 11/846,017, filed Aug. 28, 2007.

* cited by examiner

*Primary Examiner*—Paul Dinh
*Assistant Examiner*—Nha T Nguyen
(74) *Attorney, Agent, or Firm*—Ryan K. Simmons; Hoffman Warnick LLC

(57) ABSTRACT

A method is disclosed of determining allowable antenna limits for semiconductor-on-insulator (SOI) technology. In one embodiment, the method may include: determining antenna area on a gate; determining antenna area on a source/drain; determining a total gate insulator area between gate and source/drain nets; and calculating allowable antenna area as a function of the total gate insulator area between the nets such that a larger total antenna area is allowed for larger total gate insulator area between the nets.

5 Claims, 3 Drawing Sheets

DETERMINING ALLOWANCE ANTENNA AREA AS FUNCTION OF TOTAL GATE INSULATOR AREA FOR SOI TECHNOLOGY

BACKGROUND

1. Technical Field

The disclosure relates generally to charge damage evaluation of semiconductor-on-insulator (SOI) technology.

2. Background Art

One problem that exists when designing integrated circuits with silicon-over-insulator (SOI) transistors relates to detecting which SOI transistors may be susceptible to charging damage. Once detected, either design changes can be made or protection can be provided to those devices. In SOI it is impossible to "tie down" a floating gate in the traditional sense, such as by adding a diode connection to the substrate or nwell. SOI technologies are inherently less susceptible to charging damage because both the source/drain and the gate tend to have similar antennas, so the potential of both nodes varies together. This is not, however, certain in all cases.

Current treatment of SOI antennas involve examining the antennas attached to each transistor, one at a time, and calculating the allowable antenna area to determine potential for charge damage as if there were no additional or parallel current paths. An antenna is an amount of material on a net that is capable of carrying a charge. The charge carrying potential is measured by area of the antenna. Hence, the larger the area, the more charge that can be carried and the larger the likelihood of charge damage. Conventionally, each transistor not shunted by a net connection is evaluated to determine the antenna areas on the gate node and the source/drain node. For example, FIG. 1 shows a schematic diagram of an illustrative relationship between source/drain and gate antennas 10, 12 (may include either via(s) or metal wire(s) area) and a transistor 14 (shown as block for clarity). In this example, there is a source/drain (active region) antenna 10 connected to source and/or drain regions 16 of transistor 14 and a gate (polyconductor or metal) antenna 12 connected to a gate 18 of transistor 14, e.g., where polyconductor covers the active region. In this simple case, the area of source/drain and gate antennas 10 and 12 for each transistor 14 are determined and evaluated as to whether charging damage may occur. The above-described technique, however, takes a conservative approach to determine allowable antenna area in that the amount of gate insulator area that may exist between antennas 10, 12 is not considered in the above analysis.

SUMMARY

A method is disclosed of determining allowable antenna limits for semiconductor-on-insulator (SOI) technology. In one embodiment, the method may include: determining antenna area on a gate; determining antenna area on a source/drain; determining a total gate insulator area between gate and source/drain nets; and calculating allowable antenna area as a function of the total gate insulator area between the nets such that a larger total antenna area is allowed for a larger total gate insulator area between the nets.

A first aspect of the disclosure provides a method of determining allowable antenna limits for semiconductor-on-insulator (SOI) technology, the method comprising: determining antenna area on a gate; determining antenna area on a source/drain; determining a total gate insulator area between gate and source/drain nets; and calculating allowable antenna area as a function of the total gate insulator area between the nets such that a larger total antenna area is allowed for gates with a larger total gate insulator area between the nets.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
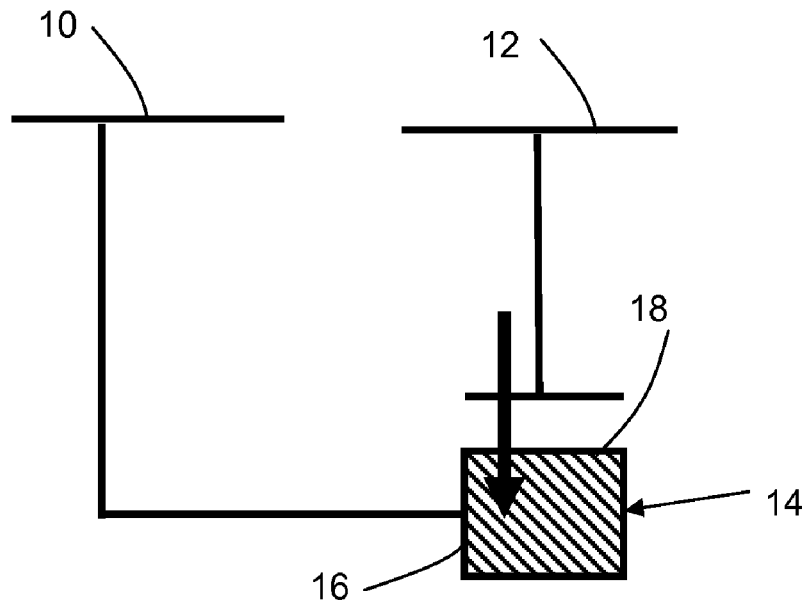
FIG. 1 shows a conventional transistor layout for charge damage evaluation.
Figure 2:
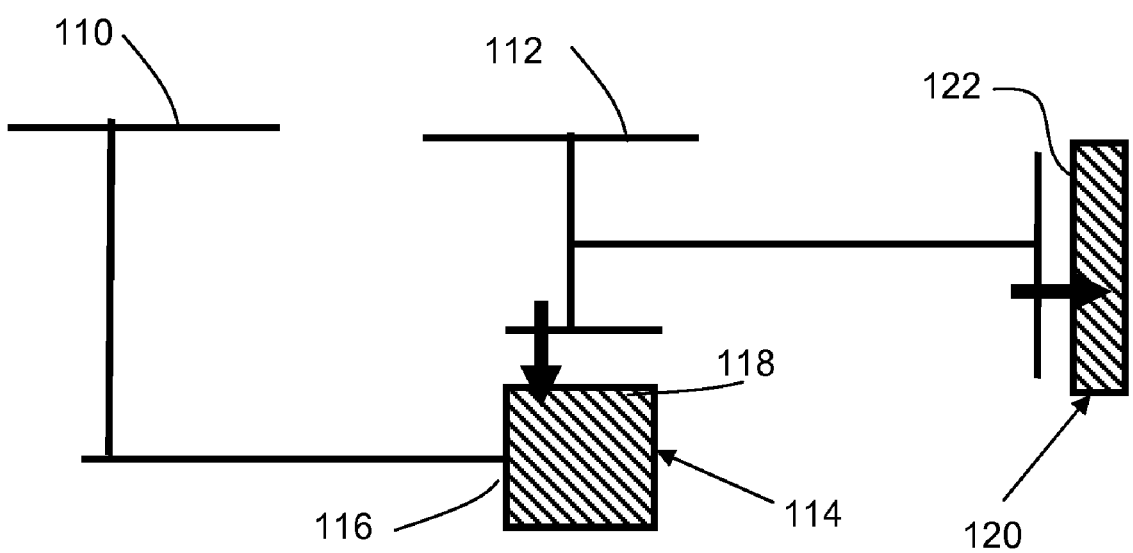
FIGS. 2-4 show transistor layouts for charge damage evaluation according to the disclosure.
Figure 3:
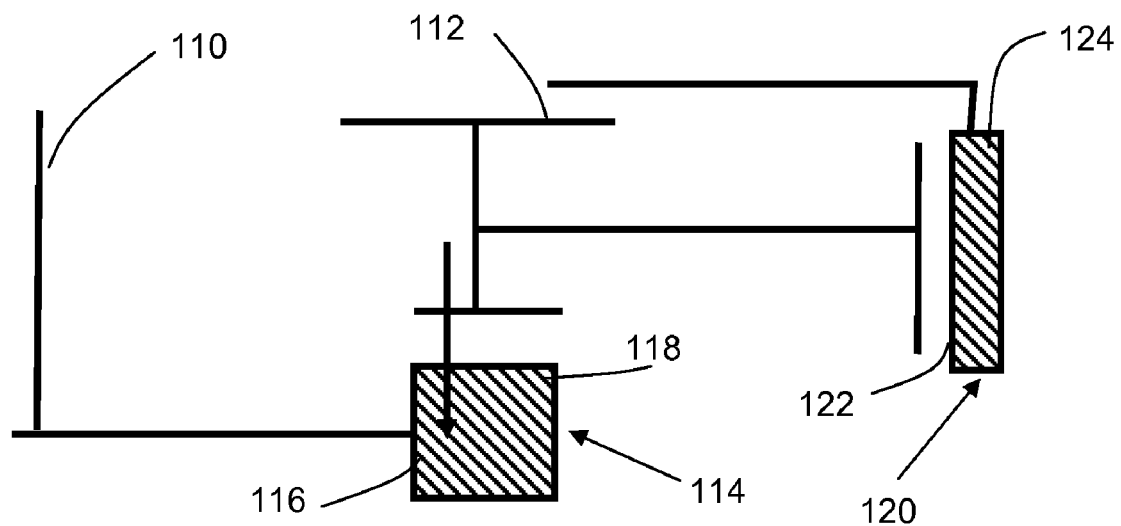

As noted herein, current approaches to determining allowable antenna area take a conservative approach in that gate insulator area that may exist between antennas (nets or nodes) are not considered. For example, FIG. 2 shows a schematic diagram of illustrative relationships between antennas 110, 112 and a transistor 114 across which the antennas are coupled. In contrast to FIG. 1, another transistor 120 providing additional gate insulator area 122 (i.e., gate dielectric or gate oxide) is present. If transistor 120 provides an additional or parallel current path from a gate 118 of transistor 114, then it may provide further design relief from charging damage. FIG. 3 shows a schematic diagram similar to FIG. 2 in which a source/drain 124 of transistor 120 is connected to the same net as gate 118. In this case, gate 122 does not provide an additional, parallel current path from gate 118 and, hence, does not provide additional allowable antenna area.

Figure 4:
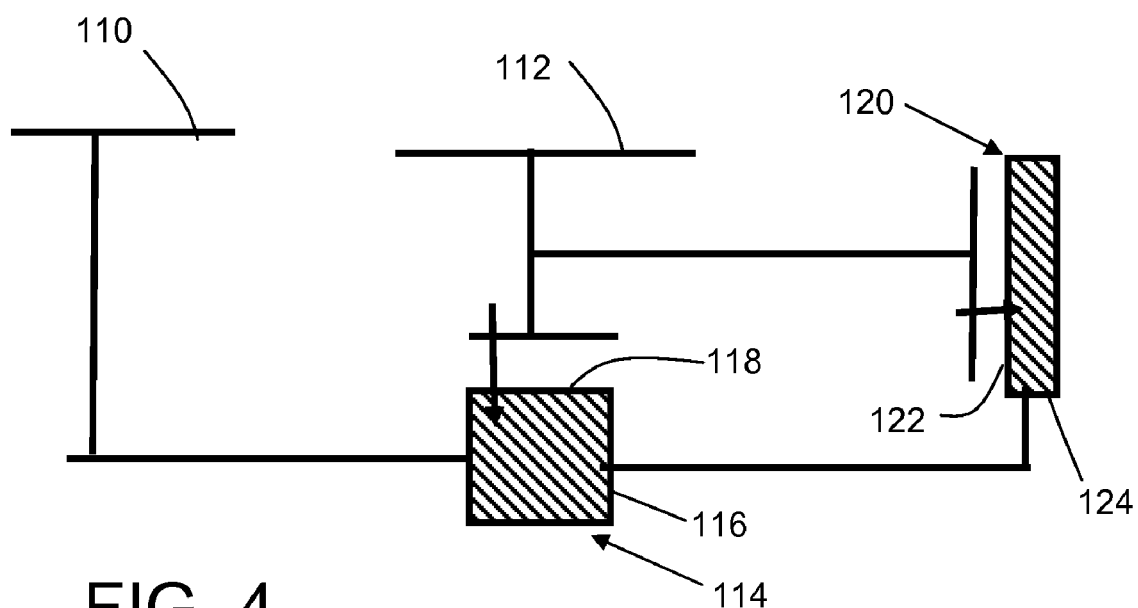

In contrast, FIG. 4 shows a schematic diagram similar to FIG. 2 in which a source/drain 124 of transistor 120 is connected to a source/drain 116 of transistor 114. In this case, gate 122 provides an additional, parallel current path, and hence, additional allowable antenna area. Ideally, half the charging current flows in each transistor 114, 120.

Figure 5:
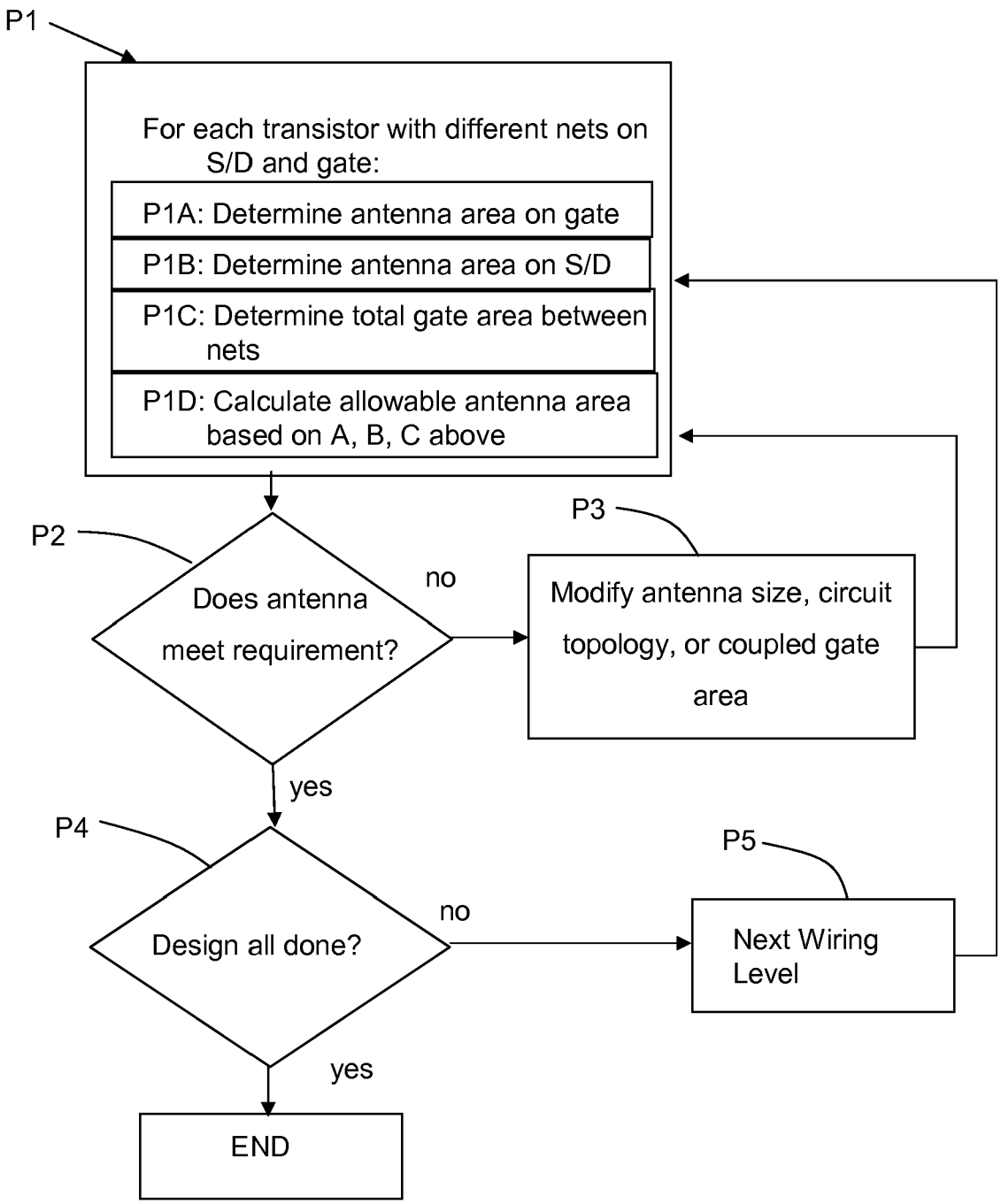
FIG. 5 shows embodiments of a method according to the disclosure.

In order to consider gate insulator area that may exist between antennas (nets or nodes), the present disclosure examines an antenna area 110 on a source/drain side 116, an antenna area 112 on a gate side 118, and a total gate insulator area between these nets, i.e., coupled gate insulator area of both gates 118 and 122. FIG. 5 shows a flow diagram representing embodiments of a process for achieving this function. In a preliminary process (not shown), conventional preliminary processes for antenna checking may be performed. These processes generally generate data about an IC design required to conduct any antenna checking. For example, shapes may be created in a computerized IC design system to represent gate insulator area, i.e., where a conductor intersects active regions. In addition, an antenna net build may be performed in which active regions are considered a conducting layer up through a first metal (M1) and first via (V1) layers. Any gate insulator area shapes on the same net above the gate or below the active region are removed from consideration. Then, the via area is measured for all nets formed, providing measures of via areas above and below each gate insulator still under consideration. (Typically, via area is used to determine the allowable antenna area, but a metal wire area may also be used.) Hence, the preliminary processes provide the known antenna area for each net, which may be used as described herein in conjunction with the gate insulator area that may exist between antennas (nets or nodes).

Continuing with FIG. 5, in a process P1, for each transistor 114 with different nets on their source/drain 116 and gate 118, processes P1A-P1D are performed. In process P1A, antenna area on gate 118 is determined. Process P1A may include any now known or later developed technique. For example, via area for the gate net, known from conventional preliminary processes, containing conductor above the gate is copied to a shape representing the gate insulator area below gate 118 as an attribute or property of that shape (this is a mechanism of the languages used to represent very large scale integrated circuit (VLSI) mask data such as GDS, GL/1 and OASIS). In process P1B, antenna area on a source/drain 116 is determined. Process P1A may include any now known or later developed technique. For example, via area for the source/drain net, known from conventional preliminary processes, containing the active region below the gate insulator is copied to a shape representing the gate insulator area above source/drain 116. Conventionally, antenna area determination for antenna checking stops at this point. However, in accordance with embodiments of the present disclosure, in process P1C, total gate insulator area between gate 118 and source/drain 116 nets, i.e., coupled-gate area, is determined. This process may be performed in a number of ways. In one embodiment, a marker shape is generated over a gate insulator area between two nets of concern and it is used to short those two nets in an additional net determination step. The sum of the gate insulator area between the now shorted nets represents the total gate insulator area, i.e., coupled gate area, between the two nets. The total gate insulator area now known for the gate insulator shapes seeing the same net above and below, due the shorting shape, is copied onto each gate insulator shape seeing the same antenna nets above and below.

In process P1D, allowable antenna area is determined (i.e., for the subset of gate insulator shapes affected by the shorting shape) as a function of the total gate insulator area between the nets such that a larger total antenna area is allowed for larger total gate insulator area between the nets. Process P1D may, of course, also calculate allowable antenna area based on antenna area of gate 118 (process P1A) and antenna area of source/drain 116 (process P1B). Process P1D may include a variety of techniques for establishing an allowable antenna area to total gate area relation, and using the allowable antenna area to total gate insulator area relation to determine the allowable antenna area.

Processes P1C-P1D are repeated across all possible pairings of antenna nets across gate insulator regions by the following means. The set of gate insulator shapes considered due to the marker shape shorting are removed from the set of all gate insulator shapes. One of the remaining, and yet to be evaluated, gate insulator shapes is chosen at random and from it a new marker shape shorting is created and the prior one deleted. The new marker shape shorting effectively selects a new set of gate insulator shapes for which the coupled gate insulator area can be determined, P1C, and the evaluations are performed, P1D. The removal of considered gate insulator sets from all possible gate insulators continues via the deletion of prior marker shape shorting and the selection of a new one until all gate insulator shapes have been evaluated.

The above-described embodiment uses shapes, information calculated and stored as properties of the shapes to implement the checking. In alternative embodiments, implementations may use an information database that makes use of 'antenna net ids.' In this case, the database may have records of the form:

gate_net_id|source/drain net id|gate net antenna area|s/d net antenna area|total gate insulator area, with an intermediate database created to calculate the last term above, the total gate insulator area. This intermediate database may contain records for each gate insulator shape of the form:

gate net id|source/drain net id|gate insulator area.

Those records having the same gate and source/drain ids would be summed to get the total gate insulator area in the final database used as each of the gate insulator shapes is evaluated.

In one embodiment, the allowable antenna area to total gate insulator area relation may be established as a linear relation, e.g., assuming an equal current density in all devices. In another embodiment, a sub-linear relation may be established such as a logarithmic relation, which is more conservative than a linear relation, and allows for non-uniform current flow. Another embodiment may employ a logarithmic relation with capping at a maximum value. For example, one logarithmic relation with cap may be represented as: for each gate, $1/(1/N \times PC+1/N \times RX) < $ maximum (50, min (15.000, 19.26+43.97 log 10 (total gate insulator area)) $\mu m^2$, where $V \times PC$ is gate antenna area and $V \times RX$ is source/drain antenna area. This approach is even more conservative. Other embodiments may employ a direct proportional relation or an algorithmic relation. In any relation, the allowable antenna area may be capped at a maximum value.

FIG. 5 further shows modifying at least one of: the antenna area, circuit topology or total gate insulator area, in response to a total antenna area exceeding the allowable antenna area. For example, at process P2, a determination is made as to whether a total antenna area, i.e., of the transistor in question, meets a requirement therefor. If NO at process P2, then at process P3, the antenna area, circuit topology and/or total gate area is/are modified to attempt correct the problem. Process P1 then repeats to determine whether the modification worked. If YES at process P2, then processing continues to processes P4-P5. In processes P4-P5, processing repeats the method, i.e., process P1-P3, for a plurality of transistors (i.e., transistors with different nets on their source/drain 116 and gate 118). In particular, in process P4, a determination is made whether evaluation of the circuit design is done. If NO at process P4, then processing proceeds at process P5 and P1 to evaluation of a next wiring level. That is, the FIG. 5 process is repeated at each level of wiring working up the wiring stack of an IC chip. For ten levels of metal, the entire antenna evaluation process is completed ten times though more and more antenna nets are effectively shorted the further up the stack one progresses. If YES at process P4, then processing ends.

The method as described above is used in the fabrication of integrated circuit chips. The process may be carried using any now known or later developed computer system for designing and evaluating circuit designs. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of determining allowable antenna limits for semiconductor-on-insulator (SOI) technology, the method comprising:
    determining antenna area on a gate net;
    determining antenna area on a source/drain net;
    determining a total gate insulator area between gate and source/drain nets by using a marker shape over a gate insulator area between the gate net and source/drain net of concern to short the gate net and the source/drain net and summing a gate insulator area between the gate net and the source/drain net to determine the total gate insulator area between the gate net and the source/drain net;
    calculating, on a computer system, allowable antenna areas for the gate net and for the source/drain net as a function of the total gate insulator area between the gate net and the source/drain net; and
    modifying at least one of: the antenna area of the gate net, the antenna area of the source/drain net, a circuit topology or the total gate insulator area, in response to the antenna area exceeding the allowable antenna area.

2. The method of claim 1, wherein the calculating includes establishing an allowable antenna area to total gate insulator area relation, and using the allowable antenna area to total gate insulator area relation to determine the allowable antenna area.

3. The method of claim 2, wherein the allowable antenna area to total gate insulator area relation is one of: a linear relation, a sub-linear relation, a direct proportional relation, an algorithmic relation and a logarithmic relation.

4. The method of claim 1, wherein the calculating includes capping the allowable antenna area at a maximum value.

5. The method of claim 1, further comprising repeating the method for a plurality of levels of an integrated circuit using the SOI technology.

* * * * *